US006177700B1

United States Patent
Lee

(10) Patent No.: US 6,177,700 B1
(45) Date of Patent: Jan. 23, 2001

(54) CAPACITOR IN A DYNAMIC RANDOM ACCESS MEMORY

(75) Inventor: Michael Lee, Ta-Li (TW)

(73) Assignee: United Integrated Circuits Corp., Hsinchu (TW)

(*) Notice: Under 35 U.S.C. 154(b), the term of this patent shall be extended for 0 days.

(21) Appl. No.: 09/250,765

(22) Filed: Feb. 16, 1999

(30) Foreign Application Priority Data

Dec. 30, 1998 (TW) ................................. 87121867

(51) Int. Cl.[7] .......................... H01L 27/108; H01L 29/76; H01L 31/119
(52) U.S. Cl. ........................ 257/306; 257/309; 257/306
(58) Field of Search ..................... 257/295–212; 438/396–399, 243–253; 361/303–305, 320–321, 313

(56) References Cited

U.S. PATENT DOCUMENTS 5,756,388 * 5/1998 Wu ........................................ 438/397

* cited by examiner

Primary Examiner—Minh Loan Tran
Assistant Examiner—Cuong Q Nguyen
(74) Attorney, Agent, or Firm—J. C. Patents; Jiawei Huang

(57) ABSTRACT

A DRAM capacitor. A first dielectric layer is formed over a substrate having a gate and source/drain regions, and a plug penetrating through the first dielectric layer to couple with the source/drain regions. A bottom electrode comprising a vertical pole, a metal plate, a first spacer and a second spacer is formed and contacts with the plug. A second dielectric layer is formed on the bottom electrode, and then a conductive layer is formed on the second dielectric layer.

12 Claims, 5 Drawing Sheets

CAPACITOR IN A DYNAMIC RANDOM ACCESS MEMORY

CROSS-REFERENCE TO RELATED APPLICATION

This application claims the priority benefit of Taiwan application Ser. No. 87121867, filed Dec. 30, 1998, the full disclosure of which is incorporated herein by reference.

BACKGROUND OF THE INVENTION

1. Field of the Invention

The present invention relates to a semiconductor device. More particularly, the present invention relates to a dynamic random access memory (DRAM) capacitor.

2. Description of the Related Art

In IC fabrication, the primary goal is to make the resulting IC device as highly integrated as possible. To achieve this goal, the various semiconductor components in the IC device should be sized as small as possible in accordance with the design rules. In the case of DRAM, however, the downsizing of the device also reduces the size of its data storage capacitor, and hence reduces the capacitance of the capacitor, resulting in a reduced data-retaining capability by the capacitor. A DRAM capacitor with a smaller capacitance requires more frequent refreshing of the data stored therein, and thus is more power consumptive and less reliable to operate.

In general, the amount of stored charges within a DRAM capacitor must be above a certain threshold level so that the stored data can be retrieved correctly. When some of the dimensions of a DRAM capacitor are reduced, the maximum amount of stored charges capable of being stored by the capacitor drops correspondingly. Furthermore, as the charge-storing capacity of the capacitor drops, frequency of refreshes necessary for compensating the lost charges due to current leakage must be increased. Constant refreshes compromise the data processing speed of the DRAM. Hence, a method to reduce the area occupation of a capacitor on a semiconductor substrate without decreasing its storage capacity is one major issue for design engineers.

A two-dimensional, planar-type capacitor is used in an integrated circuit for a conventional DRAM that stores only a small amount of charge. The planar-type capacitor occupies a sizeable surface area on a substrate. Hence, the planar type capacitor is not suitable for a highly integrated DRAM. To achieve a highly integrated DRAM in the present state of technology, many 3-dimensional types of capacitors have been proposed to increase the capacitance of the DRAM capacitor, such as a stacked-type or a trench-type capacitor. However, the trench-type capacitor causes low yield rate and low reliability in DRAM production. Therefore, this invention provides a DRAM capacitor to increase surface area for the electrode to enhance the capacitance.

SUMMARY OF THE INVENTION

Accordingly, the present invention provides a DRAM capacitor. The capacitor has a concave shape to increase the surface area of the capacitor and enhance the amount of charge (capacitance) that can be stored on the capacitor. In addition, the refresh frequency is reduced and the integration of DRAM is increased.

To achieve these and other advantages and in accordance with the purpose of the invention, as embodied and broadly described herein, the invention provides a DRAM capacitor. A first dielectric layer is formed on a substrate having a gate and source/drain regions, a contact hole penetrating through the first dielectric layer is formed to expose the source/drain regions. The contact hole is filled with conductive material to form a basic structure of bottom electrode and a plug so that it can be electrically connected with the source/drain regions. A first spacer is formed on the basic structure of bottom electrode sidewalls, a second spacer is formed beside the first spacer. The top portion of the second spacer connects with that of the first spacer and be electrically connected with the basic structure of bottom electrode. A width of the second spacer gradually extends out from top portion to lower portion, and gradually has a separation from the first spacer. A dielectric layer is formed on the basic structure of bottom electrode, the first spacer and the second spacer. A conductive layer is formed on the dielectric layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
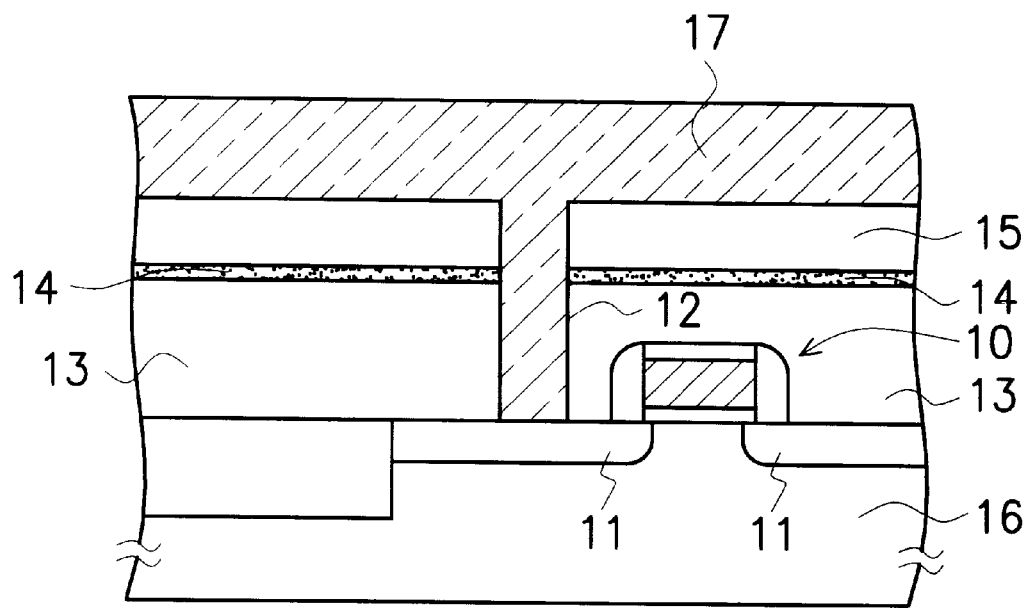
FIG. 1 is schematic, cross-sectional view of a contact hole according to this invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, a substrate 16 having a gate 10 and source/drain regions 11 is provided. A first dielectric layer 13, a passivation layer 14 and a second dielectric layer 15 are formed in order by, for example, chemical vapor deposition (CVD). The first dielectric layer 13 and the second dielectric layer 15 are made from materials such as silicon oxide or BPSG. The passivation layer 14 has a different etching rate from that of the first dielectric layer 13 and the second dielectric layer 15; the passivation layer 14 is made from a material such as silicon nitride ($SiN_x$) or silicon-oxy-nitride ($SiO_yN_z$).

An opening 12, such as a contact hole, penetrating through the first dielectric layer 13, the passivation layer 14 and the second dielectric layer 15 is formed to expose a portion of the source/drain regions 11.

Then, a conductive layer 17 for forming the lower plate of the storage electrode is deposited thereon. The conductive layer 17 with a thickness is formed on the second dielectric layer 15 and filled in the opening 12 to form a plug 17a, making electrical connection with the source/drain regions 11. The conductive layer 17 is deposited, for example, by chemical vapor deposition. The conductive layer 17 material is doped polysilicon, for example.

Figure 2:
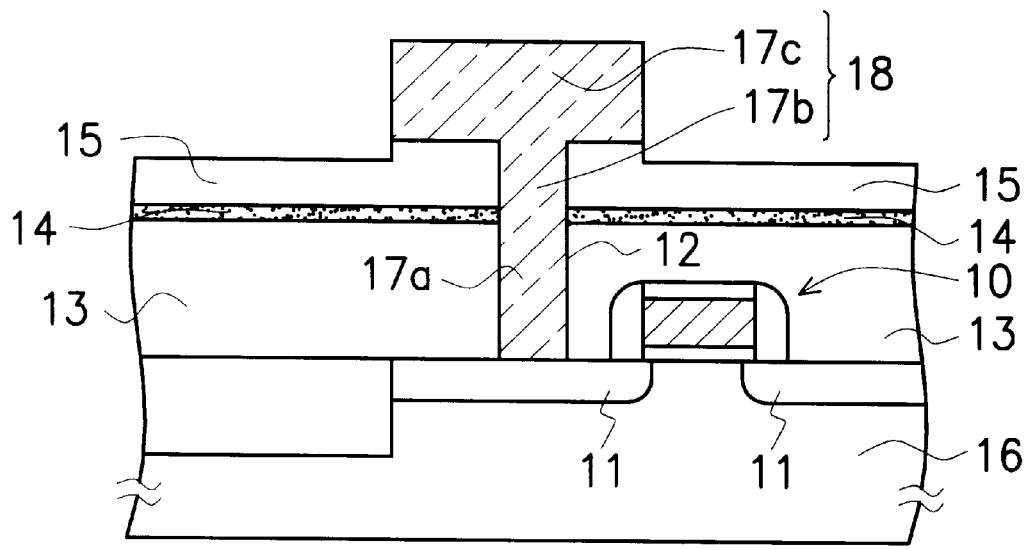
FIG. 2 is schematic, cross-sectional view of a basic structure of bottom electrode according to the preferred embodiment of this invention.

Referring to FIG. 2, a patterned photoresist layer as a mask (not shown) is formed on the conductive layer 17, and then the conductive layer 17 is etched, for example, by anisotropic etching such as dry plasma etching to define a basic structure of bottom electrode 18. A structure as shown in FIG. 2 is obtained. The basic structure of bottom electrode 18, such as a T-type structure, includes a vertical pole 17b and a horizontal conductive layer 17c as a metal plate, the basic structure of bottom electrode 18 lying on the plug 17a. The vertical pole 17b is electrically connected with the plug 17a and contact with the plug 17, the metal plate 17c lying on the vertical pole 17b to couple with the vertical pole 17b. In addition, the plug 17a surface level is substantially the same as the passivation layer 14 surface level, the vertical pole 17b lying on the plug 17a can be electrically connected with the source/drain regions 11 by the plug 17a. A portion of the second dielectric layer 15 is also removed by the etching step to expose the inside of the second dielectric layer 15. The surface level of the exposed second dielectric layer 15 is lower than the surface level of the second dielectric layer 15 covered by the metal plate 17c.

Figure 3:
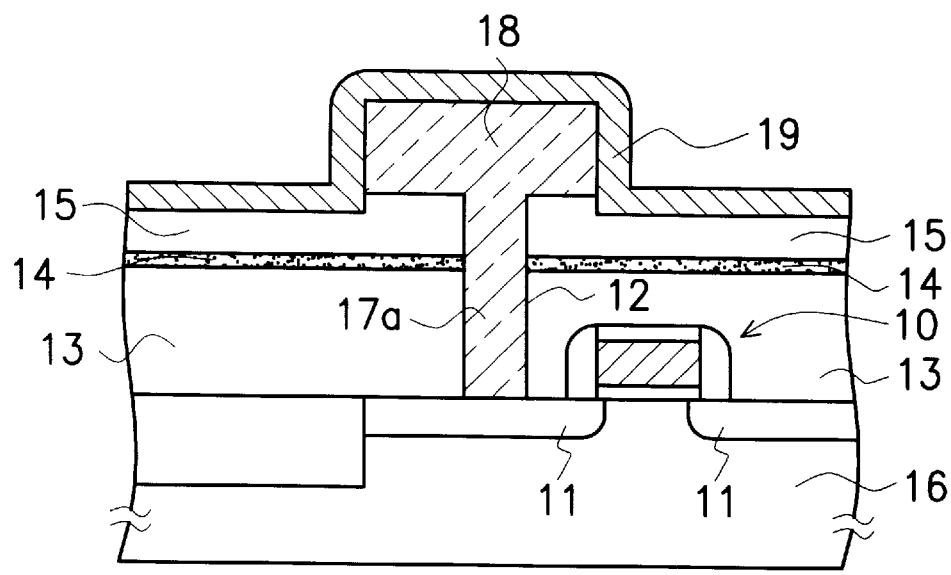
FIG. 3 through FIG. 4 are schematic, cross-sectional views of a first spacer according to the preferred embodiment of this invention.

Referring to FIG. 3, the patterned mask layer (not shown) on the basic structure of bottom electrode 18 is removed. A conductive layer 19 with a thickness is formed, for example, by chemical vapor deposition on the second dielectric layer 15 and the metal plate 17c. The conductive layer 19 is preferably made of the same material as the conductive layer 17, which can be a doped polysilicon layer, for example. The thickness of the conductive layer 19 is determined by a desired thickness of first spacer formed in a later process.

Figure 4:
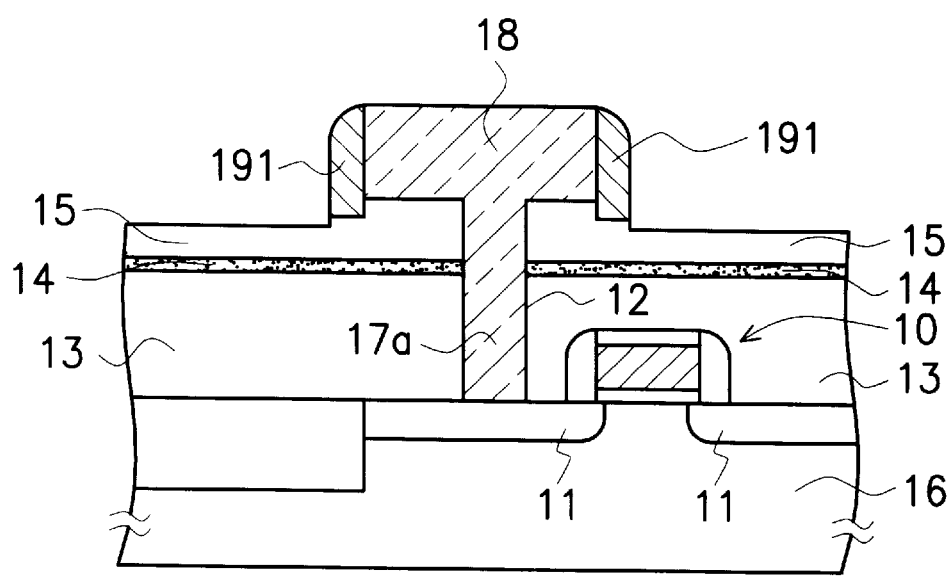

Referring to FIG. 4, the metal plate 17c is used as an etching stop layer, the conductive layer 19 is etched, for example, by anisotropic etching such as dry plasma etching to form a first spacer 191 on the metal plate 17c sidewalls. The first spacer 191 has a length longer than the sidewall of the metal plate 17c. A portion of the exposed second dielectric layer 15 is also removed by the etching step. The surface level of the exposed second dielectric layer 15 is lower than the surface level of the second dielectric layer 15 covered by the first spacer 191.

Figure 5:
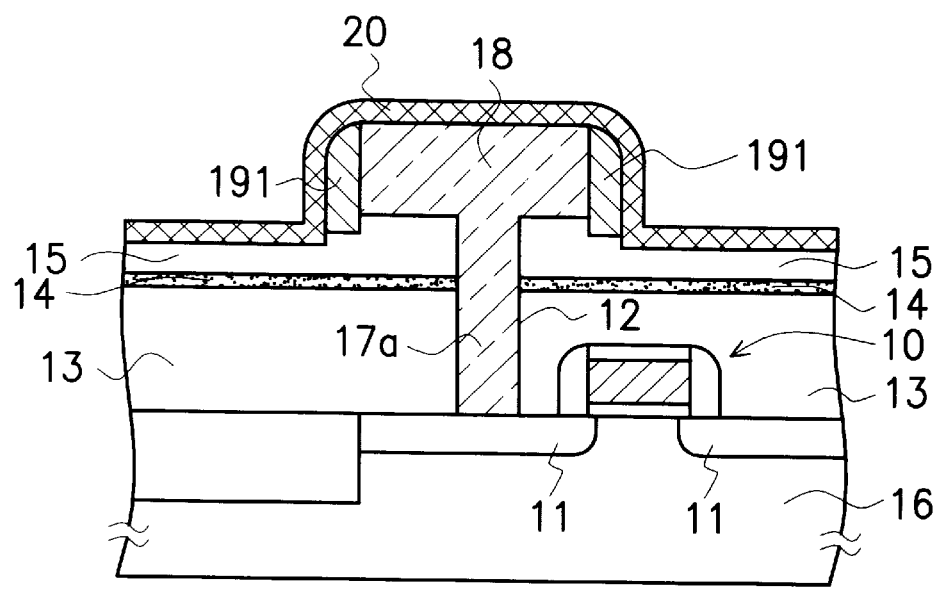
FIG. 5 through FIG. 6 are schematic, cross-sectional views of a second spacer according to the preferred embodiment of this invention.

Referring to FIG. 5, a sacrificial layer 20 is formed, for example, by chemical vapor deposition on the second dielectric layer 15, the metal plate 17c and the first spacer 191. The sacrificial layer 20 is an insulating material such as silicon oxide. The sacrificial layer 20 is used to separate the first spacer 191 from a spacer formed in a later process; therefore, the thickness of the sacrificial layer 20 is determined according to the requirements of the designed process.

Figure 6:
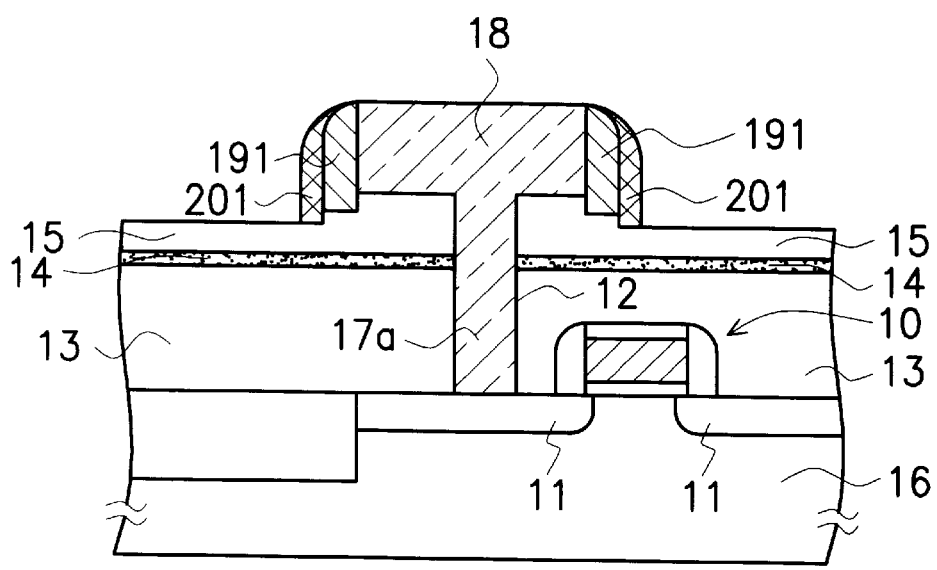

Referring to FIG. 6, the metal plate 17c is used as an etching stop layer, and the 20 sacrificial layer 20 is etched, for example, by anisotropic etching such as dry plasma etching to form a second spacer 201 covering the first spacer 191 and expose the second dielectric layer 15. The second spacer 201 has a thickness gradually increasing from top portion to lower portion on the first spacer 191 sidewalls.

Figure 7:
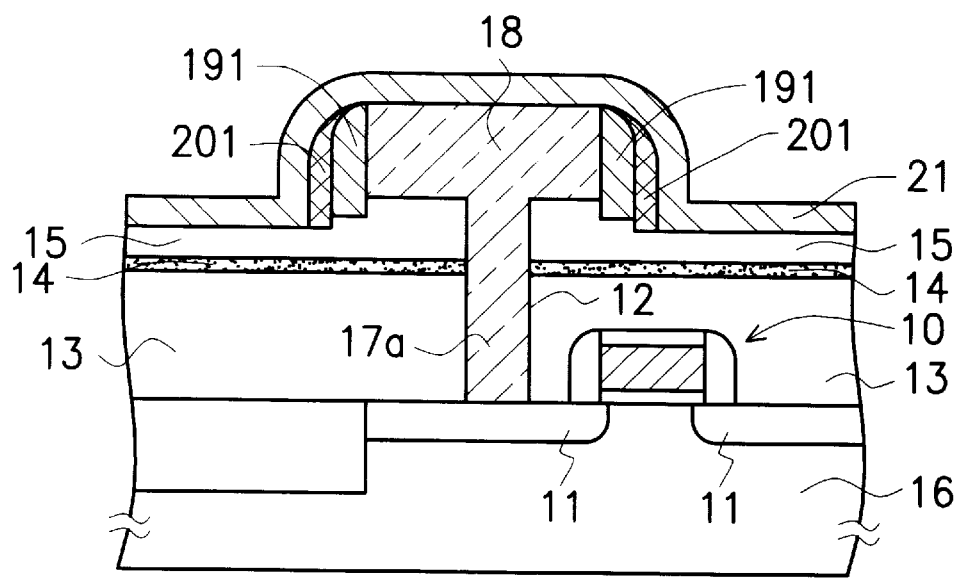
FIG. 7 through FIG. 8 are schematic, cross-sectional views of a third spacer according to the preferred embodiment of this invention.

Referring to FIG. 7, one thickness of conductive layer 21 is formed, for example, by chemical vapor deposition on the second dielectric layer 15, the metal plate 17c and the second spacer 201. The conductive layer 21 is preferably made of the same material as the conductive layer 17, which can be a doped polysilicon layer, for example. The thickness of the conductive layer 21 is determined by a desired thickness of third spacer formed in later process.

Figure 8:
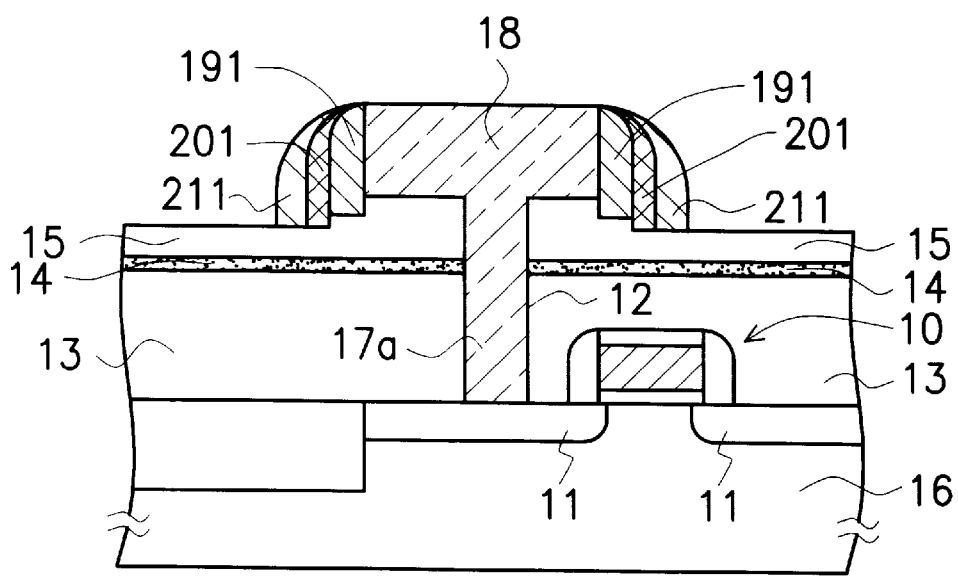

Referring to FIG. 8, the second dielectric layer 15 and the metal plate 17c are used as an etching stop layer, and the conductive layer 21 is etched, for example, by anisotropic etching such as dry plasma etching to form a third spacer 211 covering the second spacer 201 and expose the second dielectric layer 15. The third spacer 211 has a thickness gradually increasing from top portion to lower portion on the second spacer 201 sidewalls.

Figure 9:
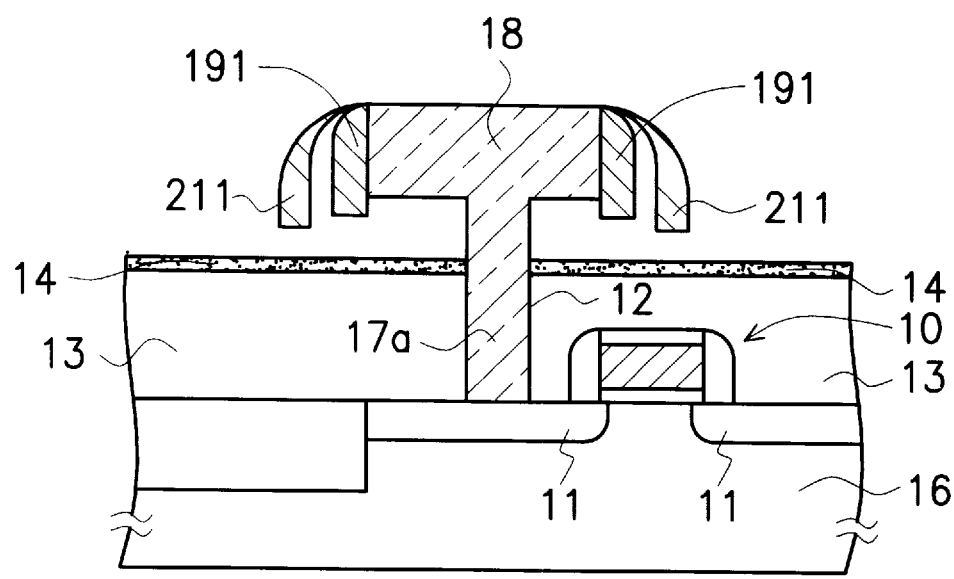
FIG. 9 is schematic, cross-sectional view of a bottom electrode according to the preferred embodiment of this invention.

Referring to FIG. 9, the passivation layer 14 is used as an etching stop layer. Because the second dielectric layer 15 and the second spacer 201 materials are the same, they are removed simultaneously, for example, by isotropic etching such as wet etching to form a gap between the first spacer 191 and the third spacer 211, the third spacer 211 having wings shape is located beside the first spacer 191. The wet etching process is performed, for example, using a hydrogen fluoride (HF) solution as an etchant. The first spacer 191 is connected with the metal plate 17c sidewalls and the top portion of the first spacer 191 is connected with that of the third spacer 211, so that the third spacer 211 can be electrically connected with the metal plate 17c by the first spacer 191. The bottom portions of the first spacer 191 and the third spacer 211 do not connect with the passivation layer 14.

According to the processes mentioned above, a bottom electrode is achieved. The bottom electrode structure includes the vertical pole 17b, the metal plate 17c, the first spacer 191 and the third spacer 211, the surface area of DRAM capacitor is increased by the gap between the first spacer 191 and the third spacer 211 as designed. It can also enhance the capacitance of the capacitor in this invention.

Figure 10:
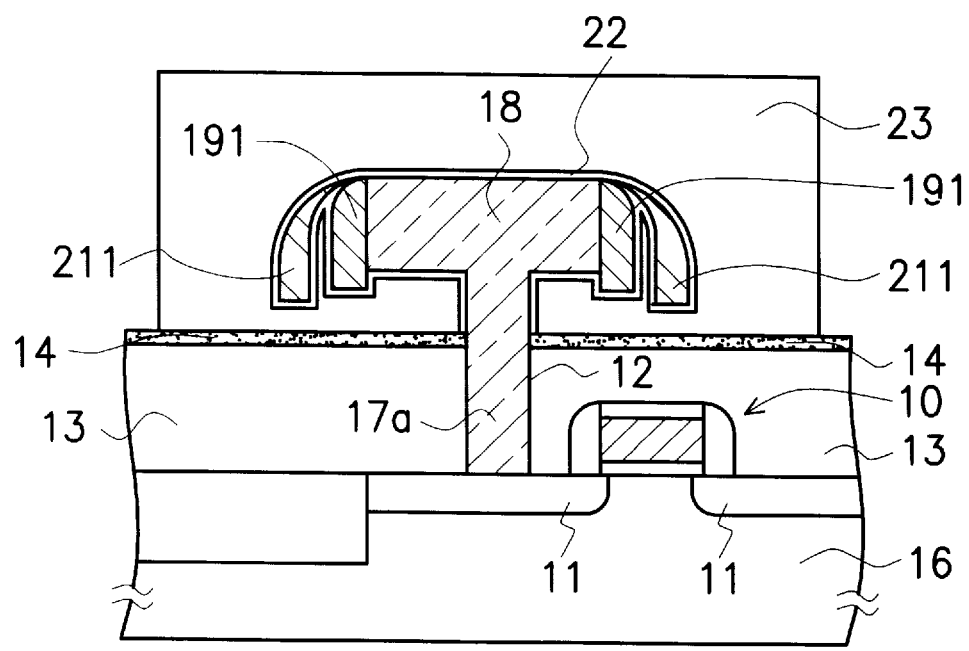
FIG. 10 is schematic, cross-sectional view of a capacitor according to the preferred embodiment of this invention.

Referring to FIG. 10, a dielectric layer 22 is formed on the bottom electrode. A conductive layer 23 as upper electrode is formed, for example, by chemical vapor deposition on the dielectric layer 22, and then a capacitor according to the invention is complete. The dielectric layer 22 is a high dielectric constant material such as silicon oxide, silicon nitride/silicon oxide (NO), silicon oxide/silicon nitride/silicon oxide layer (ONO), $Ta_2O_5$, $Pb(Zr,Ti)O_3$ (PZT) or $(Ba,Sr)TiO_3$ (BST). The conductive layer 23 is a doped polysilicon layer, for example, and the doped polysilicon layer is formed by simultaneously implanting an impurity into a polysilicon layer during deposition.

According to the processes described above, a capacitor is achieved. The surface area of DRAM capacitor is increased by the gap between the first spacer 191 and the third spacer 211 as designed. This present invention can increase the capacitance of capacitor and enhance the tolerance of the process to increase device yield and decrease capital expenditure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A DRAM capacitor, comprising:

a first dielectric layer lying over a substrate having a gate and source/drain regions;

a plug penetrating through the first dielectric layer to couple with the source/drain regions;

a bottom electrode, further comprising:

a vertical pole, which electrically connects and contacts with the plug;

a conductive plate, lying on and coupled with the vertical pole without connection to the first dielectric layer, and the conductive plate is made of a material of which the vertical pole is made;

a first conductive layer, formed on a sidewall of the conductive plate without connection to the first dielectric layer, wherein the first conductive layer has a length longer than the sidewall of the metal plate;

a second conductive layer having a wing shape with a first end contacting with a top portion of the first conductive layer, and a second end suspended, wherein the second conductive layer has a thickness gradually increasing from the first end to the second end;

a second dielectric layer, covering the bottom electrode; and an upper electrode, covering the second dielectric layer.

2. The DRAM capacitor of claim 1, wherein the second conductive layer includes a conductive material.

3. The DRAM capacitor of claim 1, wherein the first conductive layer includes a conductive material.

4. The DRAM capacitor of claim 2, wherein the conductive material includes a polysilicon layer.

5. The DRAM capacitor of claim 3, wherein the conductive material includes a polysilicon layer.

6. A DRAM capacitor, comprising:

a first dielectric layer lying over a substrate having a gate and source/drain regions;

a plug penetrating through the first dielectric layer to couple with the source/drain regions, wherein the plug surface level is substantially the same as the first dielectric layer surface level;

a bottom electrode, further comprising:

a vertical pole, which electrically connects and contacts with the plug;

a conductive plate, lying on and coupled with the vertical pole without connection to the first dielectric layer, and the conductive plate is made of a material of which the vertical pole is made;

a first conductive layer, fonned on a sidewall of the metal plate without connection to the first dielectric layer so as to be electrically connected with the metal plate, a width of the first conductive layer gradually extends out from a top portion to a lower portion, and a length of the first conductive layer is longer than the sidewall of the conductive plate;

a second conductive layer, having a wing shape with a first end contacting with a top portion of the first conductive layer, and a second end suspended, wherein a length of the second conductive layer is longer than that of the first conductive layer, the second conductive layer has a thickness gradually increasing from the first end to the second end, and gradually has a separation from the first conductive layer;

a second dielectric layer, covering the bottom electrode; and an upper electrode, covering the second dielectric layer.

7. The DRAM capacitor of claim 6, wherein a top of the first conductive layer is substantially level with a top surface of the metal plate and a bottom portion of the first conductive layer does not connect with the metal plate sidewalls.

8. The DRAM capacitor of claim 6, wherein the second conductive layer includes conductive material.

9. The DRAM capacitor of claim 6, wherein the first conductive layer includes conductive material.

10. The DRAM capacitor of claim 8, wherein the conductive material includes a polysilicon layer.

11. The DRAM capacitor of claim 9, wherein the conductive material includes a polysilicon layer.

12. The DRAM capacitor of claim 6, wherein the second conductive layer is used as an upper electrode.

* * * * *